(12) United States Patent
Liao et al.

(10) Patent No.: US 12,158,675 B2
(45) Date of Patent: *Dec. 3, 2024

(54) ELECTRONIC DEVICE

(71) Applicant: Innolux Corporation, Miao-Li County (TW)

(72) Inventors: Hsiao Feng Liao, Miao-Li County (TW); Shu-Fen Li, Miao-Li County (TW); Chuan-Chi Chien, Miao-Li County (TW); Po-Yang Chen, Miao-Li County (TW); I-An Yao, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/455,618

(22) Filed: Aug. 24, 2023

(65) Prior Publication Data

US 2023/0400739 A1 Dec. 14, 2023

Related U.S. Application Data

(63) Continuation of application No. 17/669,390, filed on Feb. 11, 2022, now Pat. No. 11,789,326.

(30) Foreign Application Priority Data

Mar. 3, 2021 (CN) .......................... 202110234963.8

(51) Int. Cl.
*G02F 1/1362* (2006.01)
*G02F 1/1333* (2006.01)
*G02F 1/1343* (2006.01)
*H01L 27/146* (2006.01)

(52) U.S. Cl.
CPC .. *G02F 1/136209* (2013.01); *G02F 1/133345* (2013.01); *G02F 1/13338* (2013.01); *G02F 1/134309* (2013.01); *G02F 1/136286* (2013.01); *H01L 27/14623* (2013.01); *H01L 27/14678* (2013.01)

(58) Field of Classification Search
None
See application file for complete search history.

(56) References Cited

U.S. PATENT DOCUMENTS 11,789,326 B2 * 10/2023 Liao ................. G02F 1/136286
349/12
2013/0120760 A1 5/2013 Raguin et al.

FOREIGN PATENT DOCUMENTS

TW 201118492 6/2011

* cited by examiner

Primary Examiner — Dung T Nguyen
(74) Attorney, Agent, or Firm — JCIPRNET

(57) ABSTRACT

A display device includes a backlight module and a display panel. The display panel is disposed on the backlight module and includes two substrates, a sensor, and a light-shielding element. The sensor is disposed between the two substrates. The light-shielding element at least partially surrounds the sensor. A height of the light-shielding element is greater than a height of the sensor.

15 Claims, 14 Drawing Sheets

1A

ELECTRONIC DEVICE

CROSS-REFERENCE TO RELATED APPLICATION

This application is a continuation application of and claims the priority benefit of U.S. application Ser. No. 17/669,390, filed on Feb. 11, 2022, which claims the priority benefit of China application serial no. 202110234963.8, filed on Mar. 3, 2021. The entirety of each of the above-mentioned patent applications is hereby incorporated by reference herein and made a part of this specification.

BACKGROUND OF THE DISCLOSURE

Field of the Disclosure

The disclosure relates to an electronic device, in particular to a display device.

Description of Related Art

When a sensor (such as a photosensor) is disposed in the display panel, the sensor is readily irradiated by stray light, thus affecting the sensor sensing an image.

SUMMARY OF THE DISCLOSURE

The disclosure provides a display device that may reduce the influence of stray light on the sensor.

According to some embodiments of the disclosure, the display device includes a backlight module and a display panel. The display panel is disposed on the backlight module and includes two substrates, a sensor, and a light-shielding element. The sensor is disposed between the two substrates. The light-shielding element at least partially surrounds the sensor. A height of the light-shielding element is greater than a height of the sensor.

According to some other embodiments of the disclosure, a display device includes a backlight module and a display panel. The display panel is disposed on the backlight module and includes two substrates, a sensor, and a light-shielding element. The sensor is disposed between the two substrates. A portion of the light-shielding element is extended between the sensor and the backlight module, and an extension length of the portion of the light-shielding element is greater than or equal to a height of the sensor.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
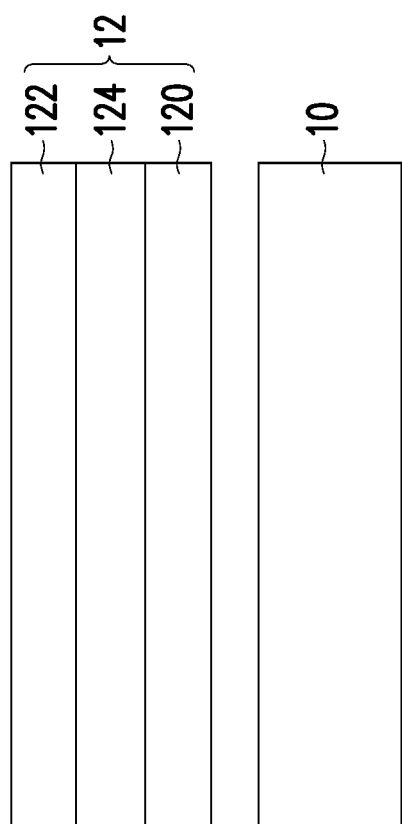
FIG. 1 to FIG. 10 are respectively partial cross-sectional schematic diagrams of display devices according to a plurality of embodiments of the disclosure.

The disclosure may be understood by referring to the following detailed description in conjunction with the accompanying figures. It should be noted that, in order to facilitate the reader's understanding and the conciseness of the figures, the multiple figures in the disclosure depict a portion of the electronic device/display device, and specific elements in the figures are not drawn according to actual scale. In addition, the number and size of each element in the figures are for illustration, and are not intended to limit the scope of the disclosure. For example, for clarity, the relative size, thickness, and position of each film layer, region, or structure may be reduced or enlarged.

Certain terms are used throughout the specification and the appended claims of the disclosure to refer to particular elements. Those skilled in the art should understand that electronic equipment manufacturers may refer to the same elements under different names. This article is not intended to distinguish between elements having the same function but different names. In the following description and claims, the words "having" and "including" and the like are open words, so they should be interpreted as meaning "including but not limited to . . . "

The terminology mentioned in the specification, such as: "up", "down", "front", "rear", "left", "right", etc., are directions referring to the figures. Therefore, the directional terms used are used for illustration, not for limiting the disclosure. It should be understood that when an element or film layer is referred to as disposed "on" or "connected" to another element or film layer, the element or film layer may be directly on the other element or film layer or directly connected to the other element or film layer, or there is an inserted element or film layer between the two (indirect case). Conversely, when an element or film layer is referred to as "directly" on or "directly connected" to another element or film layer, there is no intervening element or film layer between the two.

The term "about", "equal", "same", "equivalent", "substantially", or "essentially" mentioned in the specification usually means falling within 10% of a given value or range, or means falling within 5%, 3%, 2%, 1%, or 0.5% of a given value or range. In addition, the phrases "the given range is from a first numerical value to a second numerical value" and "the given range falls within the range of a first numerical value to a second numerical value" mean that the given range contains the first numerical value, the second numerical value, and other values in between.

In some embodiments of the disclosure, terms such as "connection", "interconnection", "contact", etc. regarding bonding and connection, unless specifically defined, may mean that two structures are in direct contact, or that two structures are not in direct contact and there are other structures located between these two structures. The terms of bonding and connecting may also include the case where both structures are movable or both structures are fixed. In addition, the terms "electrically connected" and "coupled" include any direct and indirect electrical connection means.

In the following embodiments, the same or similar elements adopt the same or similar reference numerals and are not described again. In addition, the features in different embodiments may be mixed and matched arbitrarily as long as they do not violate the spirit of the disclosure or conflict with each other, and simple equivalent changes and modifications made in accordance with the specification or claims still fall within the scope of the disclosure. In addition, terms such as "first" and "second" mentioned in the specification or claims are used to name different elements or to distinguish different embodiments or ranges, and are not used to limit the upper limit or the lower limit of the number of elements and are also not used to limit the manufacturing order or arrangement order of the elements.

An electronic device of disclosure may include a display device, an antenna device, a sensing device, a light-emitting device, or a tiling device, but is not limited thereto. The electronic device may include a bendable or flexible electronic device. The electronic device may, for example, include a liquid-crystal layer or a light-emitting diode. The light-emitting diode may include, for example, an organic light-emitting diode (OLED), a mini LED, a micro LED, or a quantum dot light-emitting diode (may include QLED or QDLED), fluorescence, phosphor, or other suitable materials, or a combination of the above, but is not limited thereto. The following uses a display device as an electronic device to explain the content of the disclosure, but the disclosure is not limited thereto.

The display device of the disclosure is, for example, a non-self-luminous display device, but the disclosure is not limited thereto. The non-self-luminous display device may include a liquid-crystal display device, but the disclosure is not limited thereto. The following uses a liquid-crystal display device as a display device to explain the content of the disclosure, but the disclosure is not limited thereto.

FIG. 1 to FIG. 10 are respectively partial cross-sectional schematic diagrams of display devices according to a plurality of embodiments of the disclosure. FIG. 11 to FIG. 14 are respectively partial top schematic diagrams of display devices according to a plurality of embodiments of the disclosure.

Please refer to FIG. 1, a display device 1 may include a backlight module 10 and a display panel 12. The backlight module 10 may be configured to provide an illuminating beam to the display panel 12. For example, the backlight module 10 may include a direct-type backlight module or an edge-type backlight module, which is not limited herein.

The display panel 12 is disposed on the backlight module 10 to receive the illuminating beam from the backlight module 10. Taking the liquid-crystal display panel as an example, the display panel 12 may include a first substrate structure 120, a second substrate structure 122 disposed on the first substrate structure 120, and a liquid-crystal layer 124 disposed between the first substrate structure 120 and the second substrate structure 122.

The first substrate structure 120 may be an element array substrate structure. Although not shown in FIG. 1, the first substrate structure 120 may include a substrate and a circuit, an element (such as a switch element), an electrode, and/or other suitable layers or elements and the like disposed on the substrate, but the disclosure is not limited thereto.

The second substrate structure 122 may be a color filter substrate structure. Although not shown in FIG. 1, the second substrate structure 122 may include a substrate and a light-shielding layer, a light filter layer, an electrode, and/or other suitable layers or elements and the like disposed on the substrate, but the disclosure is not limited thereto. In some embodiments, the light filter layer or the light-shielding layer may be disposed on the substrate in the first substrate structure 120.

In order to facilitate the reader's understanding and the conciseness of the figures, FIG. 2 to FIG. 10 schematically show partial regions of the backlight module and the first substrate structure in the display device. For other structures not shown, please refer to the description of FIG. 1, which are not be repeated below.

Figure 2:
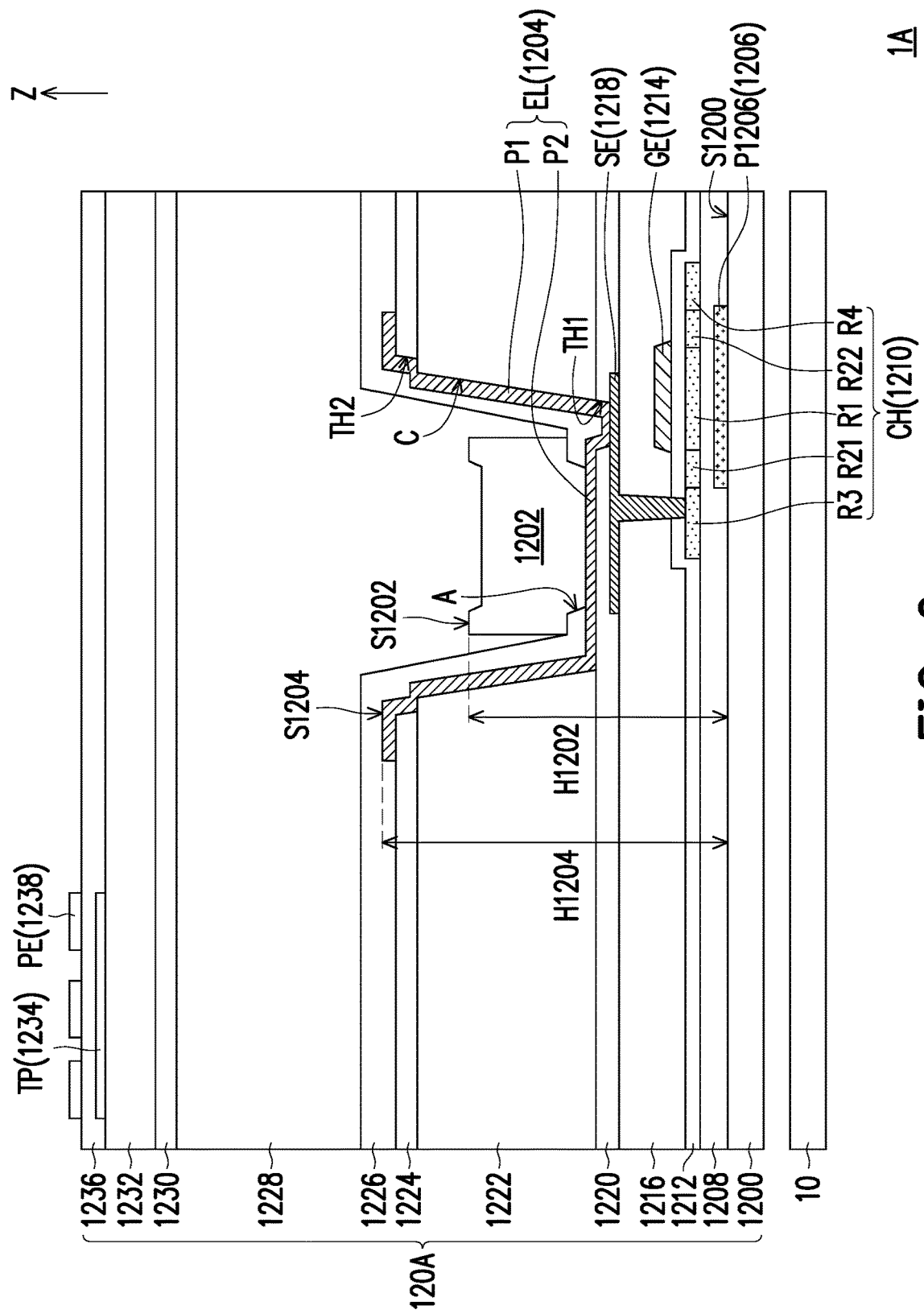

Referring to FIG. 2, a display device 1A may include two substrates (such as a substrate 1200 of a first substrate structure 120A and the substrate of the second substrate structure 122 in FIG. 1), a sensor 1202, and a light-shielding element 1204.

Two substrates may be configured to carry elements and/or film layers. For example, the respective materials of the two substrates may include glass, plastic, other suitable materials, or a combination of the above, but the disclosure is not limited thereto.

The sensor 1202 may be disposed between the two substrates. The sensor 1202 may be configured to receive a light beam. For example, the sensor 1202 may be configured to receive light beam reflected by a finger pressing on the display device 1A to facilitate subsequent fingerprint recognition, but the disclosure is not limited thereto. The sensor 1202 may include a photodetector, such as a PIN junction photodiode or a PN junction photodiode, but the disclosure is not limited thereto. In an embodiment, the sensor 1202 may include a P-type semiconductor layer, an N-type semiconductor layer, and a low-doped semiconductor layer. The low-doped semiconductor layer may be located between the P-type semiconductor layer and the N-type semiconductor layer, but the disclosure is not limited thereto.

The light-shielding element 1204 at least partially surrounds the sensor 1202 to reduce the influence of stray light on the sensor 1202 (for example, to reduce the stray light received by the sensor 1202). In some embodiments, the light-shielding element 1204 may include a light-absorbing element, a light-reflecting element, or a combination of the above. In the present embodiment, as shown in FIG. 2, the light-shielding element 1204 may include a light-reflecting element, but the disclosure is not limited thereto. For example, a bottom electrode EL configured to be electrically connected to the sensor 1202 may be used as the light-shielding element 1204. The bottom electrode EL reflects the stray light incident toward the sensor 1202, so that the influence of the stray light on the sensor 1202 may be reduced.

Under the architecture of the bottom electrode EL as the light-shielding element 1204, the light-shielding element 1204 may include a portion P1 and a portion P2. The portion P1 may surround the sensor 1202, and the portion P2 may be further extended between the sensor 1202 and the backlight module 10, wherein the portion P2 of the light-shielding element 1204 is in contact with the sensor 1202 and is a conductor. For example, the material of the portion P2 may include metal, alloy, other suitable conductors, other suitable light-shielding materials, or a combination of the above, but the disclosure is not limited thereto. The portion P1 and/or the portion P2 may have a single-layer or multi-layer structure, but the disclosure is not limited thereto. In some embodiments, the material of the light-shielding element 1204 may also include a combination of a transparent conductive material (such as indium tin oxide) and a light-shielding material, but the disclosure is not limited thereto.

In the present embodiment, as shown in FIG. 2, the portion P1 and the portion P2 are connected to each other. The portion P1 and the portion P2 may be formed by the same patterning process and may be formed by the same material to simplify the process, but the disclosure is not limited thereto. In other embodiments, the portion P1 and the portion P2 may be separated from each other, formed by different patterning processes, and/or formed by different materials.

In some embodiments, as shown in FIG. 2, a height H1204 of the light-shielding element 1204 may be greater than a height H1202 of the sensor 1202 to block stray light from a high place. The height H1204 of the light-shielding element 1204 may be defined as the maximum distance from a certain plane (lower than the plane of the light-shielding element 1204 and the sensor 1202, such as an upper surface S1200 of the substrate 1200) to a top surface S1204 of the light-shielding element 1204 (for example: the surface of the light-shielding element 1204 furthest away from the upper surface S1200) in a thickness direction Z of the display device 1A. Similarly, the height H1202 of the sensor 1202 may be defined as the maximum distance from the plane (such as the upper surface S1200 of the substrate 1200) to the top surface S1202 of the sensor 1202 (for example: the surface of the sensor 1202 furthest away from the upper surface S1200) in the thickness direction Z of the display device 1A. In other embodiments, the maximum distance between the bottom surface of the light-shielding element 1204 and the top surface S1204 may be defined as the height of the light-shielding element 1204, and at the same time, the maximum distance between the bottom surface of the light-shielding element 1204 and the top surface S1202 of the sensor 1202 is defined as the height of the sensor 1202, but the disclosure is not limited thereto. The method of making the height H1204 of the light-shielding element 1204 greater than the height H1202 of the sensor 1202 may include forming a recess C in one or a plurality of insulating layers (such as an insulating layer 1222) of the display device 1A, and disposing the light-shielding element 1204 in the recess C, wherein the portion P2 of the light-shielding element 1204 may be disposed on the bottom of the recess C, and the portion P1 of the light-shielding element 1204 may be disposed on the sidewall of the recess C. Moreover, the sensor 1202 may be disposed in the recess C and on the light-shielding element 1204. For example, the sensor 1202 may be disposed on the portion P2 of the light-shielding element 1204, so that the height H1204 of the light-shielding element 1204 is greater than the height H1202 of the sensor 1202, but the disclosure is not limited thereto. In some embodiments, the insulating layer 1222 may include an organic insulating layer, but the disclosure is not limited thereto.

According to different requirements, the display device 1A may also include other elements or film layers. Taking FIG. 2 as an example, in addition to the substrate 1200, the sensor 1202, the light-shielding element 1204, and the insulating layer 1222, the first substrate structure 120A of the display device 1A may further include a light-shielding layer 1206, an insulating layer 1208, a semiconductor layer 1210, a gate insulating layer 1212, a first conductive layer 1214, an insulating layer 1216, a second conductive layer 1218, an insulating layer 1220, an insulating layer 1224, an insulating layer 1226, an insulating layer 1228, an insulating layer 1230, an insulating layer 1232, a first light-transmitting conductive layer 1234, an insulating layer 1236, and a second light-transmitting conductive layer 1238, but the disclosure is not limited thereto. One or a plurality of elements or film layers may be added or removed in the first substrate structure 120A according to requirements. The above insulating layer may include an organic insulating layer or an inorganic insulating layer. The above insulating layer may be a single layer or multilayer structure. In an embodiment of the multilayer structure, the insulating layer may include a stacked structure of an organic insulating layer and an inorganic insulating layer, but the disclosure is not limited thereto.

The light-shielding layer 1206 may be disposed on the substrate 1200. For example, the material of the light-shielding layer 1206 may include metal, alloy, black matrix, other suitable materials (such as light-reflecting material or light-absorbing material), or a combination of the above, but the disclosure is not limited thereto. The light-shielding layer 1206 may be a patterned film layer. For example, the light-shielding layer 1206 may include a plurality of light-shielding patterns P1206 (one is schematically shown in FIG. 2), but the disclosure is not limited thereto.

The insulating layer 1208 may be disposed on the light-shielding layer 1206 and the substrate 1200. The insulating layer 1208 may be an inorganic insulating layer, but the disclosure is not limited thereto. For example, the material of the insulating layer 1208 may include silicon oxide, silicon nitride, or a combination of the above, but the disclosure is not limited thereto.

The semiconductor layer 1210 may be disposed on the insulating layer 1208, and the semiconductor layer 1210 may be separated/electrically insulated from the light-shielding layer 1206 via the insulating layer 1208. For example, the material of the semiconductor layer 1210 may include polysilicon, amorphous silicon, metal oxide, or a combination thereof, but the disclosure is not limited thereto. In the present embodiment, the semiconductor layer 1210 is, for example, a polysilicon semiconductor layer, and the semiconductor layer 1210 may include a plurality of semiconductor patterns CH (one is schematically shown in FIG. 2). The semiconductor patterns CH may include a channel region R1, a low-doped region R21, a low-doped region R22, a source region R3, and a drain region R4, wherein the low-doped region R21 is located between the channel region R1 and the source region R3, and the low-doped region R22 is located between the channel region R1 and the drain region R4. In some embodiments, the first substrate structure 120 may include a plurality of semiconductor layers, such as a silicon semiconductor layer (such as polysilicon or amorphous silicon) and a metal-oxide semiconductor layer. The figures schematically show one semiconductor layer.

The plurality of semiconductor patterns CH and the plurality of light-shielding layers 1206 may be overlapped in the thickness direction Z of the display device 1A. Unless otherwise specified, the "overlap" in the disclosure may include complete overlap and partial overlap. By disposing the light-shielding layer 1206 between the backlight module 10 and the semiconductor layer 1210, the light-shielding layer 1206 may shield (for example, reflect or absorb) light beams incident on the semiconductor layer 1210, thus further helping to reduce the influence of the light beam from the backlight module on the semiconductor layer 1210.

The gate insulating layer 1212 may be disposed on the semiconductor layer 1210 and the insulating layer 1208. In an embodiment, the insulating layer 1212 may be an inorganic insulating layer, but the disclosure is not limited thereto. For example, the material of the insulating layer 1212 may include silicon oxide, silicon nitride, or a combination of the above, but the disclosure is not limited thereto.

Figure 11:
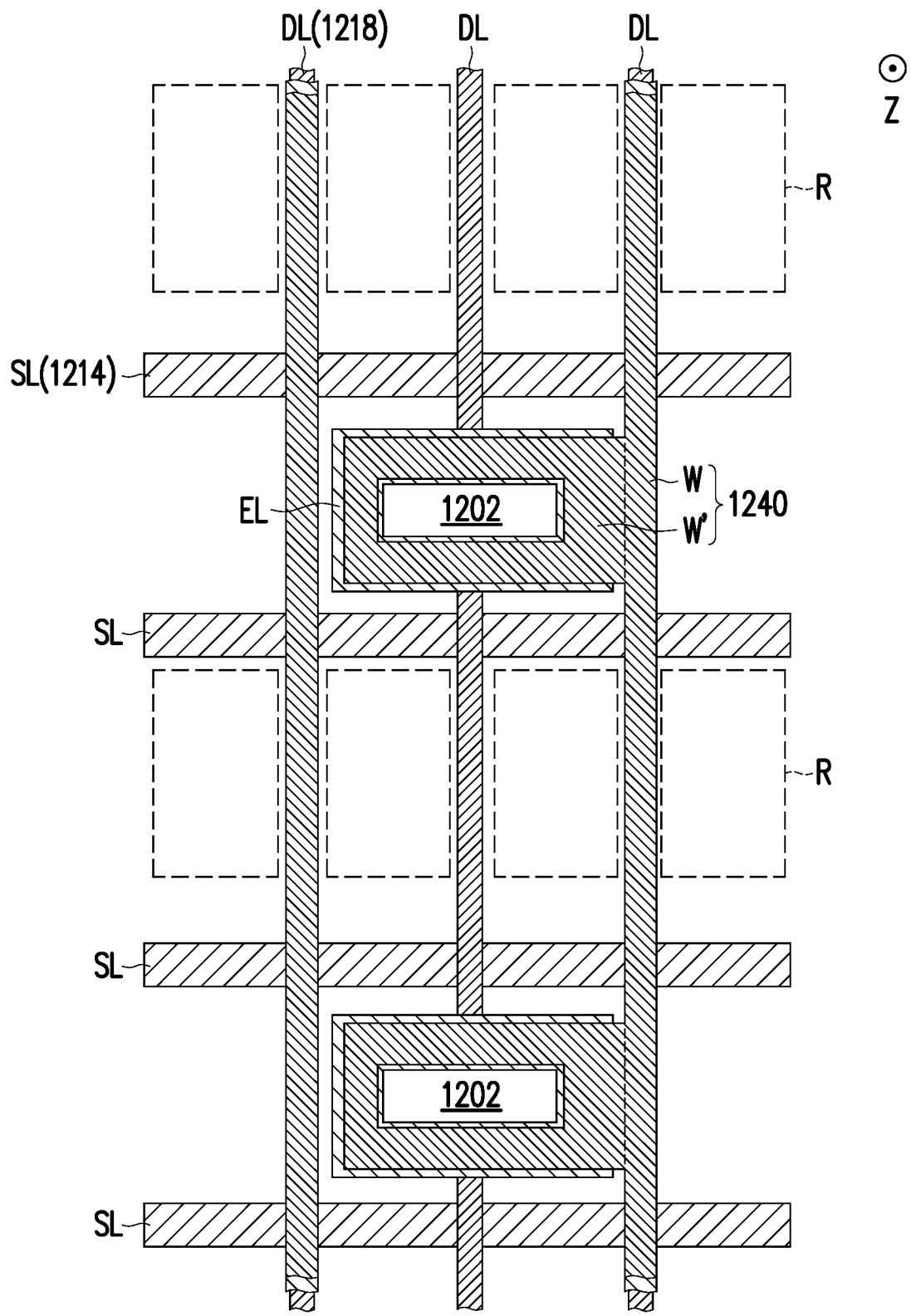
FIG. 11 to FIG. 14 are respectively partial top schematic diagrams of display devices according to a plurality of embodiments of the disclosure.

The first conductive layer 1214 may be disposed on the gate insulating layer 1212, and the first conductive layer 1214 may be separated/electrically insulated from the semiconductor layer 1210 via the gate insulating layer 1212. For example, the material of the first conductive layer 1214 may include metal, alloy, or a combination of the above, but the disclosure is not limited thereto. The first conductive layer 1214 may be a patterned film layer. For example, the first conductive layer 1214 may include a plurality of gates GE (one is schematically shown in FIG. 2) and other circuits (a plurality of scan lines SL as shown in FIG. 11), but the disclosure is not limited thereto. The plurality of gates GE and the plurality of semiconductor patterns CH are overlapped in the thickness direction Z of the display device 1A.

It should be understood that although FIG. 2 schematically shows a top-gate switch element, the type of the switch element in the first substrate structure 120A may be changed according to requirements, and is not limited to that shown in FIG. 2. For example, in other embodiments not shown, the switch element in the first substrate structure 120A may also include a bottom-gate switch element or a double-gate switch element. Under the architecture of a bottom-gate switch element or a double-gate switch element, the light-shielding layer 1206 may be optionally omitted or the area of the light-shielding layer 1206 may be reduced, but the disclosure is not limited thereto.

The insulating layer 1216 may be disposed on the first conductive layer 1214 and the gate insulating layer 1212. In an embodiment, the insulating layer 1216 may be an inorganic insulating layer or an organic insulating layer, but the disclosure is not limited thereto. For example, the material of the insulating layer 1216 may include silicon oxide, silicon nitride, or a combination of the above, but the disclosure is not limited thereto.

The second conductive layer 1218 may be disposed on the insulating layer 1216. In an embodiment, the second conductive layer 1218 may be separated/electrically insulated from the first conductive layer 1214 via the insulating layer 1216. For example, the material of the second conductive layer 1218 may include metal, alloy, or a combination of the above, but the disclosure is not limited thereto. The second conductive layer 1218 may be a patterned film layer. For example, the second conductive layer 1218 may include a plurality of sources SE (one is schematically shown in FIG. 2), a plurality of drains (not shown), and other circuits (a plurality of data lines DL as shown in FIG. 11), but the disclosure is not limited thereto. Each of the sources SE may penetrate through the insulating layer 1216 and the insulating layer 1212 to be in contact with the corresponding source region R3. Similarly, each drain (not shown) may penetrate through the insulating layer 1216 and the insulating layer 1212 to be in contact with the corresponding drain region R4.

The insulating layer 1220 may be disposed on the second conductive layer 1218 and the insulating layer 1216. In an embodiment, the insulating layer 1220 may be an inorganic insulating layer, but the disclosure is not limited thereto. For example, the material of the insulating layer 1220 may include silicon oxide, silicon nitride, or a combination of the above, but the disclosure is not limited thereto. The insulating layer 1220 may have a through hole TH1 exposing the sources SE.

The insulating layer 1222 may be disposed on the insulating layer 1220. In an embodiment, the insulating layer 1222 may be an organic insulating layer, but the disclosure is not limited thereto. For example, the material of the insulating layer 1222 may include acrylic resin, photosensitive resin, polyimide, polymer, or a combination of the above, but the disclosure is not limited thereto. The recess C of the insulating layer 1222 may expose the through hole TH1 of the insulating layer 1220.

The insulating layer 1224 may be disposed on the insulating layer 1222. The insulating layer 1224 may be an inorganic insulating layer, but the disclosure is not limited thereto. For example, the material of the insulating layer 1224 may include silicon oxide, silicon nitride, or a combination of the above, but the disclosure is not limited thereto. The insulating layer 1224 may have a through hole TH2, and the through hole TH2 may expose the recess C. In an embodiment, the light-shielding element 1204 may be disposed on the insulating layer 1224 and may be in contact with the corresponding source SE via the through hole TH2, the recess C, and/or the through hole TH1.

The insulating layer 1226 may be disposed on the light-shielding layer 1204 and the insulating layer 1224. In an embodiment, the insulating layer 1226 may be an inorganic insulating layer, but the disclosure is not limited thereto. For example, the material of the insulating layer 1226 may include silicon oxide, silicon nitride, or a combination of the above, but the disclosure is not limited thereto. The insulating layer 1226 may have an opening A exposing a portion of the light-shielding element 1204. The sensor 1202 may be in contact with/electrically connected to the light-shielding element 1204 via the opening A.

The insulating layer 1228 is disposed on the sensor 1202 and the insulating layer 1226. In an embodiment, the insulating layer 1228 may be an organic insulating layer, but the disclosure is not limited thereto. For example, the material of the insulating layer 1228 may include acrylic resin, photosensitive resin, polyimide, polymer, or a combination of the above, but the disclosure is not limited thereto.

The insulating layer 1230 and the insulating layer 1232 may be sequentially disposed on the insulating layer 1228. In an embodiment, the insulating layer 1230 and the insulating layer 1232 may be inorganic insulating layers, but the disclosure is not limited thereto. For example, the material of the insulating layer 1230 and the insulating layer 1232 may include silicon oxide, silicon nitride, or a combination of the above, but the disclosure is not limited thereto.

The first light-transmitting conductive layer 1234 may be disposed on the insulating layer 1232. For example, the material of the first light-transmitting conductive layer 1234 may include metal oxide (such as indium tin oxide), graphene, or metal mesh, but the disclosure is not limited thereto. The first light-transmitting conductive layer 1234 may be a patterned film layer. For example, the first light-transmitting conductive layer 1234 may include a plurality of touch elements TP (one is schematically shown in FIG. 2) and other circuits (not shown, such as a plurality of conductive wires), but the disclosure is not limited thereto.

The insulating layer 1236 may be disposed on the first light-transmitting conductive layer 1234 and the insulating layer 1232. In an embodiment, the insulating layer 1236 may be an inorganic insulating layer, but the disclosure is not limited thereto. For example, the material of the insulating layer 1236 may include silicon oxide, silicon nitride, or a combination of the above, but the disclosure is not limited thereto.

The second light-transmitting conductive layer 1238 may be disposed on the insulating layer 1236, and the second light-transmitting conductive layer 1238 may be separated/electrically insulated from the first light-transmitting layer 1234 via the insulating layer 1236. For example, the material of the second light-transmitting conductive layer 1238 may include metal oxide (such as indium tin oxide), graphene, or metal mesh, but the disclosure is not limited thereto. The second light-transmitting conductive layer 1238 may be a patterned film layer. For example, the second light-transmitting conductive layer 1238 may include a plurality of pixel electrodes PE (three are schematically shown in FIG. 2) and other circuits (not shown, such as a plurality of conductive wires), but the disclosure is not limited thereto.

Please refer to FIG. 3, the main differences between a display device 1B and the display device 1A of FIG. 2 are as follows. In a first substrate structure 120B of the display device 1B, in addition to the light-shielding element (for example, the bottom electrode EL), a light-shielding element 1204B also includes a light-shielding element AB. For example, the material of the light-shielding element AB may include a light-reflecting material or a light-absorbing material (for example, black resin or other light-absorbing materials), but the disclosure is not limited thereto. The light-shielding element AB may be in contact with/connected to the bottom electrode EL via a through hole TH3. In an embodiment, the through hole TH3 may penetrate through the insulating layer 1236, the insulating layer 1232, the insulating layer 1230, and the insulating layer 1228 and be extended into the insulating layer 1226 to expose a portion of the bottom electrode EL, but the disclosure is not limited thereto.

Figure 3:
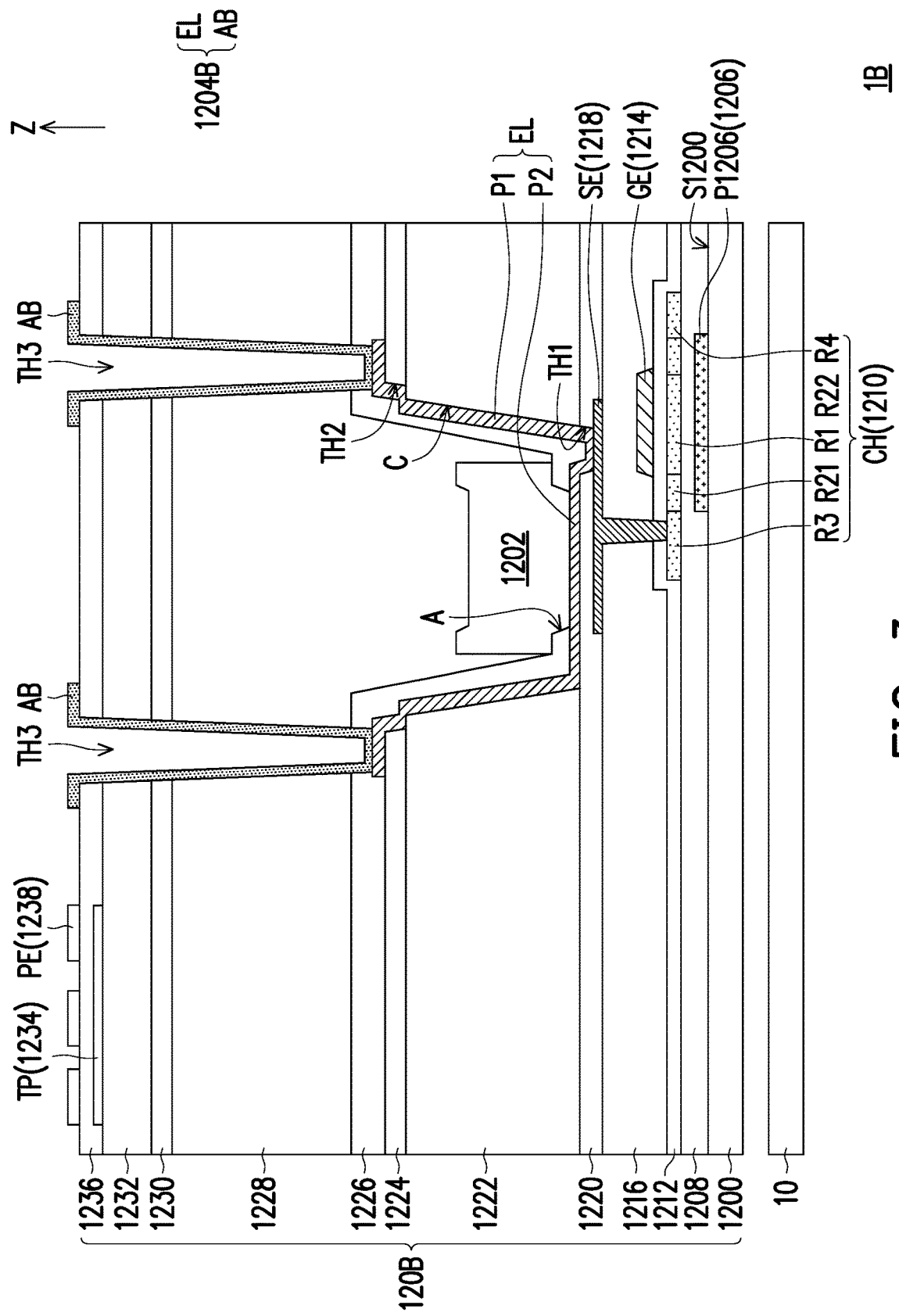
Figure 4:
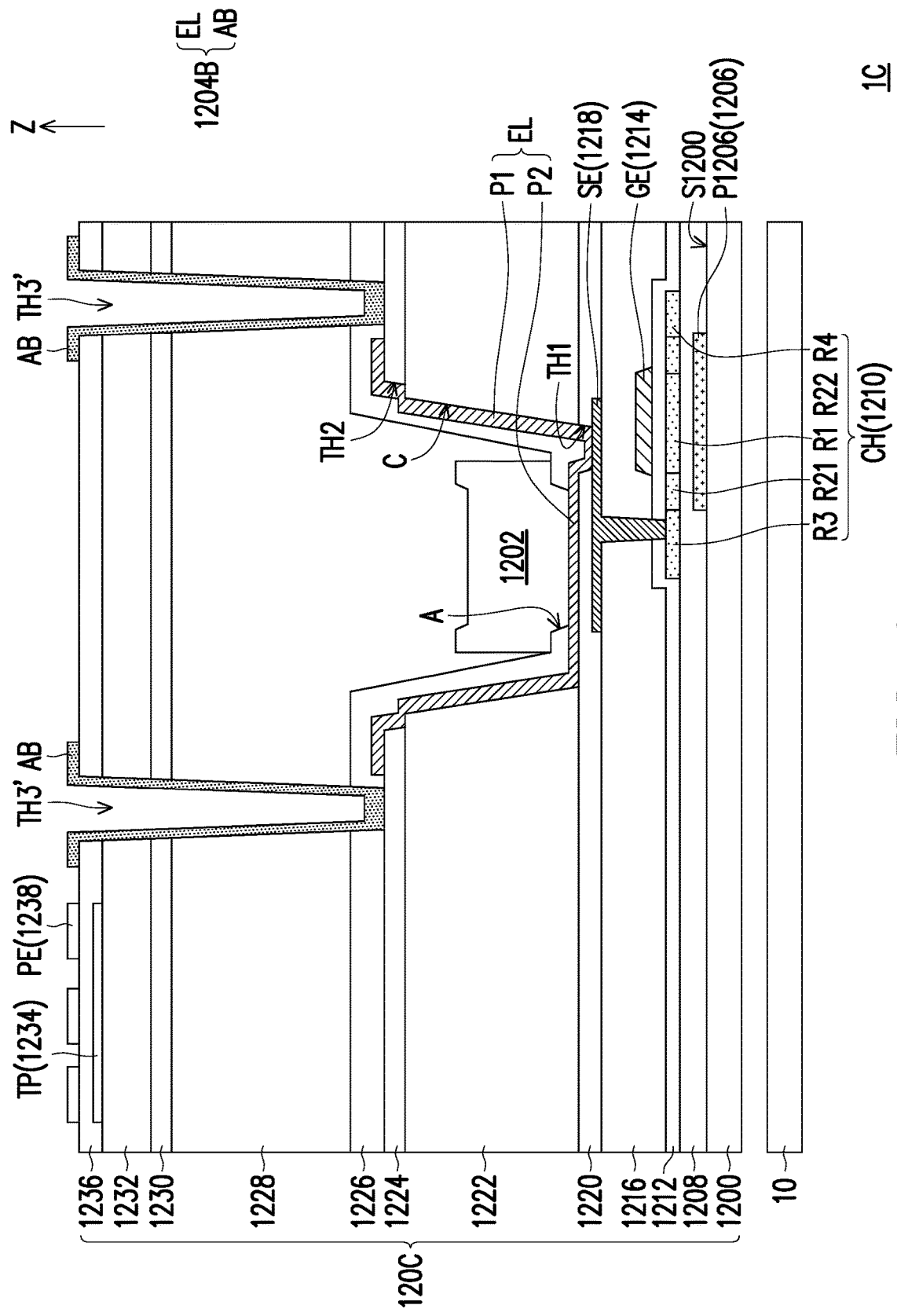

Please refer to FIG. 4, the main differences between a display device 1C and the display device 1B of FIG. 3 are as follows. In a first substrate structure 120C of the display device 1C, the light-shielding element AB does not need to be in contact with/connected to the bottom electrode EL. In addition, the light-shielding element AB may be in contact with/connected to the insulating layer 1224 via a through hole TH3'. The through hole TH3' may penetrate through the insulating layer 1236, the insulating layer 1232, the insulating layer 1230, the insulating layer 1228, and the insulating layer 1226 to expose the insulating layer 1224.

Please refer to FIG. 5, the main differences between a display device 1D and the display device 1A of FIG. 2 are as follows. In a first substrate structure 120D of the display device 1D, a light-shielding element 1204D may include the portion P2 extended between the sensor 1202 and the backlight module 10 and does not need to include the portion P1 surrounding the sensor 1202 (refer to FIG. 2).

In an embodiment, the portion P2 of the light-shielding element 1204D may be disposed on the insulating layer 1224 and extended into the through hole TH2, the recess C, and the through hole TH1 to be in contact with the corresponding source SE. In addition, the height of the portion P2 of the light-shielding element 1204D (i.e., the height H1204 of the light-shielding element 1204D) may be smaller than the height H1202 of the sensor 1202, but the disclosure is not limited thereto.

Moreover, an extension length L1204 of the portion P2 of the light-shielding element 1204D may be greater than or equal to a thickness T1202 of the sensor 1202, so as to reduce the probability that the light beam emitted from the backlight module 10 directly irradiates the sensor 1202. The extension length L1204 of the portion P2 may be defined as the shortest distance between an edge E1204 of the portion P2 and an edge E1202 of the sensor 1202. The thickness T1202 of the sensor 1202 may be defined as the maximum thickness of the sensor 1202 in the thickness direction Z of the display device 1A.

Figure 5:
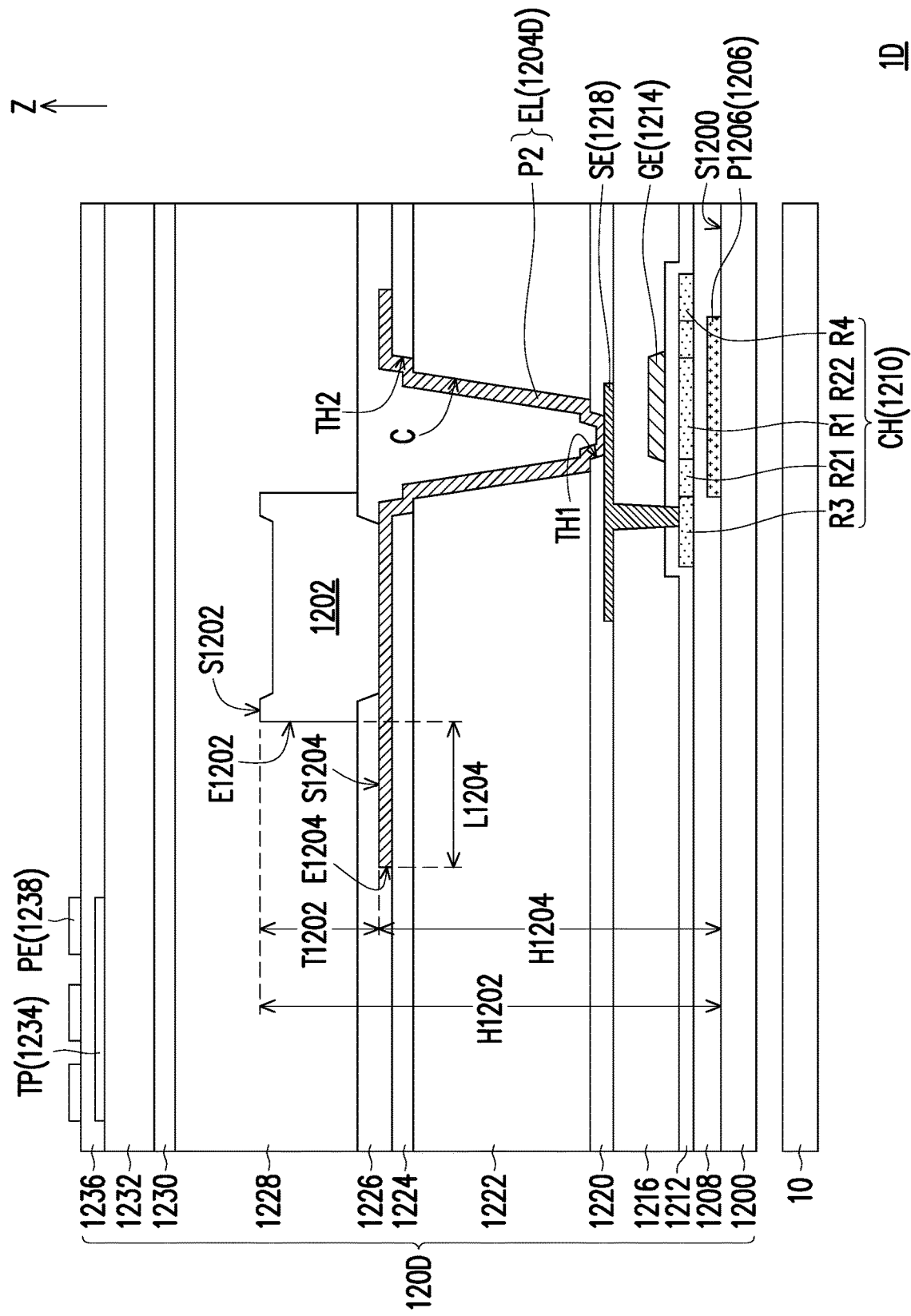
Figure 6:
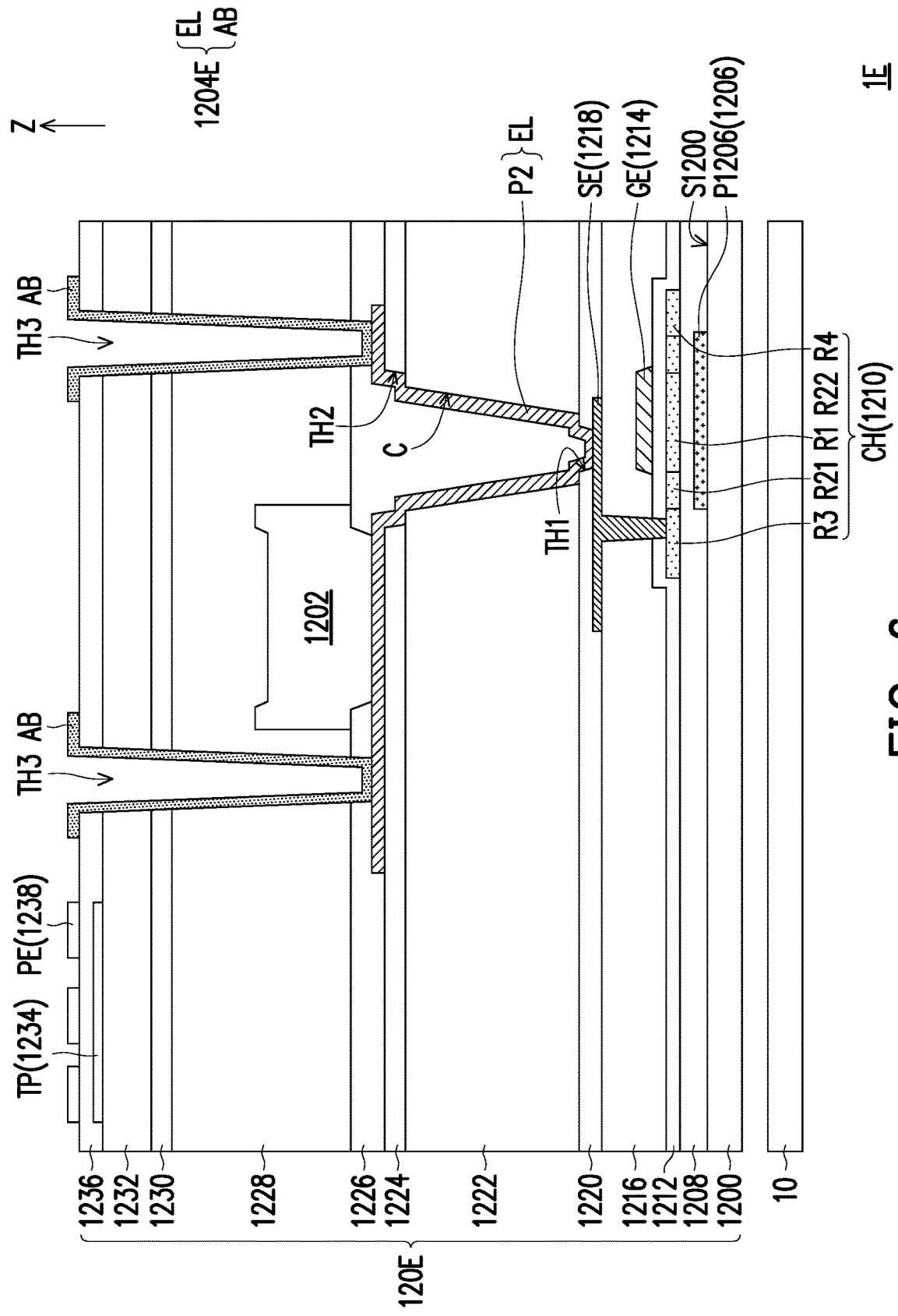

Please refer to FIG. 6, the main differences between a display device 1E and the display device 1D of FIG. 5 are as follows. In a first substrate structure 120E of the display device 1E, in addition to the light-shielding element (the bottom electrode EL), a light-shielding element 1204E may also include the light-shielding element AB. For example, the material of the light-shielding element AB may include a light-reflecting material or a light-absorbing material (for example, black resin or other light-absorbing materials). The light-shielding element AB may be in contact with/connected to the bottom electrode EL via the through hole TH3. The through hole TH3 may penetrate through the insulating layer 1236, the insulating layer 1232, the insulating layer 1230, and the insulating layer 1228 and be extended into the insulating layer 1226 to expose a portion of the bottom electrode EL. In other embodiments not shown, the through hole TH3 of FIG. 6 may be replaced with the through hole TH3' of FIG. 4, and the light-shielding element AB may be in contact with/connected to the insulating layer 1224 via the through hole TH3', but the disclosure is not limited thereto.

Please refer to FIG. 7, the main differences between a display device 1F and the display device 1D of FIG. 5 are as follows. A first substrate structure 120F of the display device 1F further includes a fourth conductive layer 1240. The material of the fourth conductive layer 1240 may include metal, alloy, or a combination of the above, but the disclosure is not limited thereto.

In an embodiment, the fourth conductive layer 1240 may be disposed on the insulating layer 1230 and may be a patterned film layer. For example, the fourth conductive layer 1240 may include a plurality of signal wires W (two are schematically shown in FIG. 7) and other circuits (not shown), but the disclosure is not limited thereto. Each of the signal wires W may be in contact with/connected to the insulating layer 1226 via a through hole TH4 penetrating through the insulating layer 1230 and the insulating layer 1228. In addition, the signal wires W may be separated/electrically insulated from the third conductive layer where the bottom electrode EL is located via the insulating layer 1226, but the disclosure is not limited thereto. The signal wires W, the bottom electrode EL located under the signal wires W, and the insulating layer 1226 between the two may form a capacitor. In some embodiments, this capacitor may be used as the storage capacitor of the sensor 1202 to compensate for the insufficient storage capacitor caused by insufficient area. In other embodiments not shown, the through hole TH4 may be further extended into the insulating layer 1226 to expose a portion of the bottom electrode EL, and the signal wires W may be in contact with/connected to the bottom electrode EL via the through hole TH4 to shield more stray light.

In the present embodiment, the bottom electrode EL and the signal wires W may both be light-reflecting elements, and therefore may both be used as a light-shielding element 1204F. In the light-shielding element 1204F formed by the bottom electrode EL and the signal wires W, the bottom electrode EL may be disposed between the sensor 1202 and the backlight module 10 to block stray light from a low place (close to the side of the substrate 1200). Moreover, the signal wires W surround the sensor 1202 to block stray light from a high place (close to the side of the pixel electrodes PE).

Figure 7:
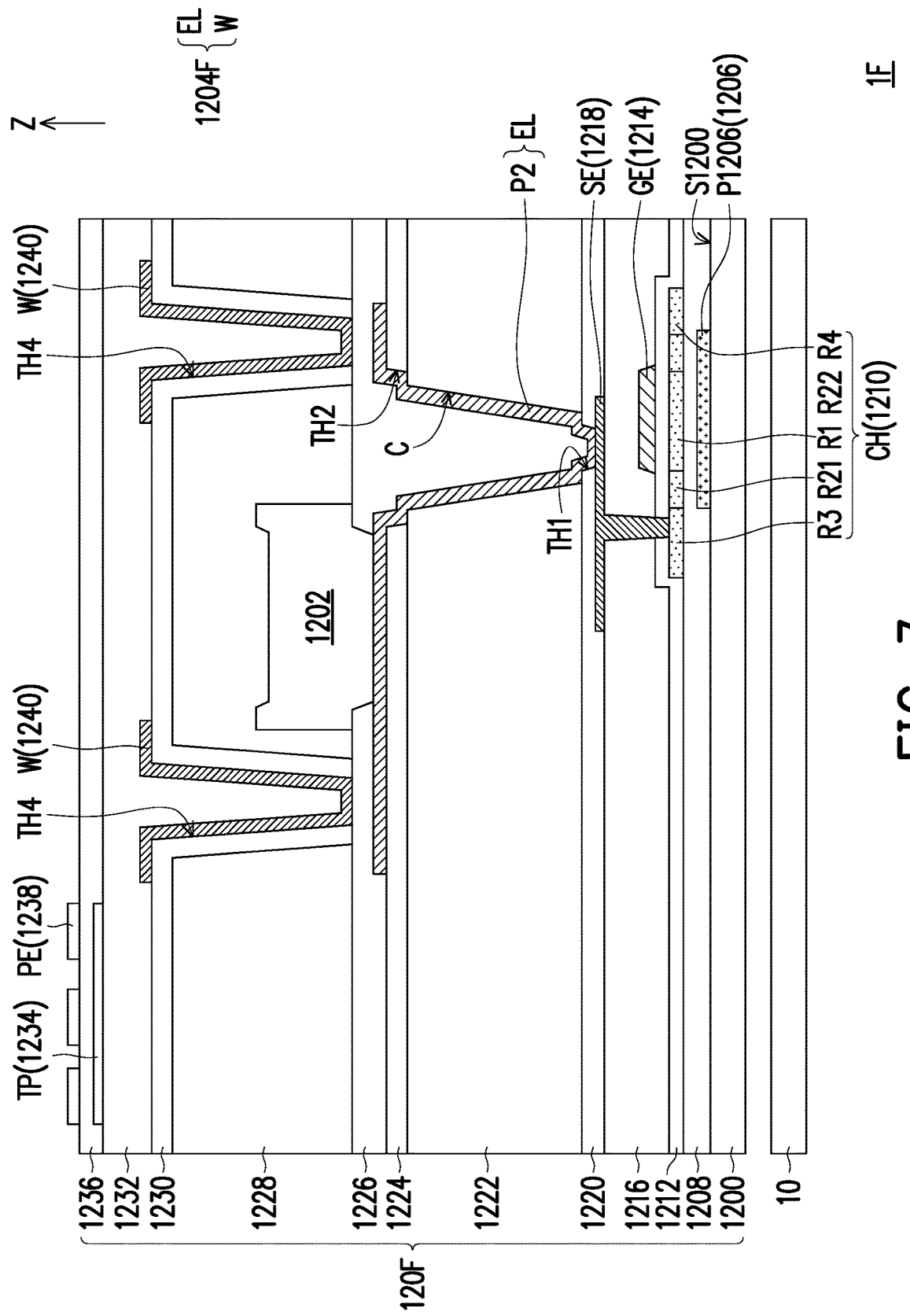
Figure 8:
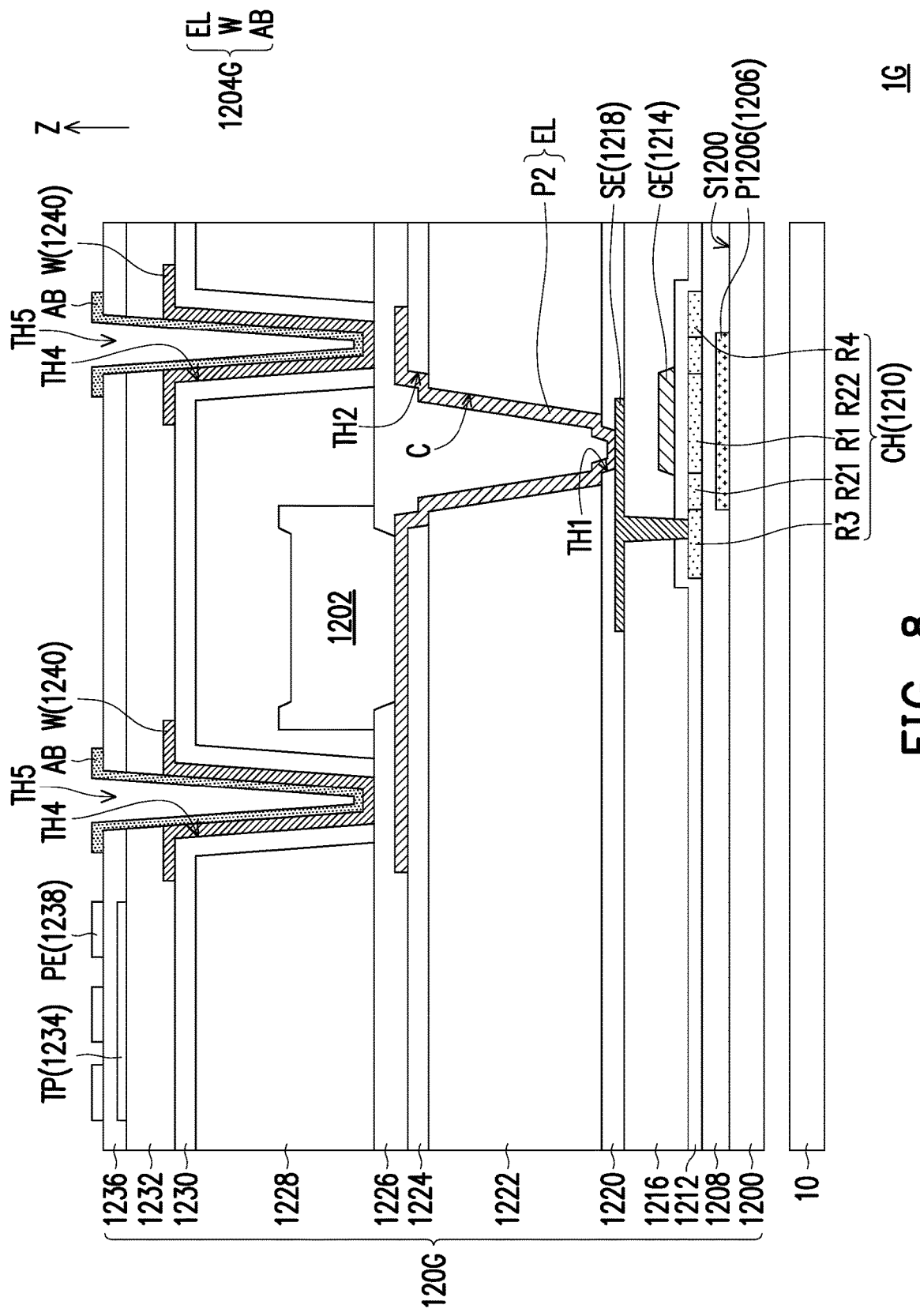

Please refer to FIG. 8, the main differences between a display device 1G and the display device 1F of FIG. 7 are as follows. In a first substrate structure 120G of the display device 1G, in addition to the light-shielding element (the bottom electrode EL and the signal wires W), a light-shielding element 1204G may also include the light-shielding element AB. For example, the light-shielding element AB is, for example, a light-absorbing element. The material of the light-shielding element AB may include black resin or other light-absorbing materials. The light-shielding element AB may be in contact with/connected to the signal wires W via a through hole TH5. The through hole TH5 may penetrate through the insulating layer 1236 and the insulating layer 1232 and be extended into the through hole TH4 to expose a portion of the signal wires W. In the architecture of FIG. 8, the through hole TH4 may also be further extended into the insulating layer 1226 to expose a portion of the bottom electrode EL, and the signal wires W may be in contact with/connected to the bottom electrode EL via the through hole TH4.

Figure 9:
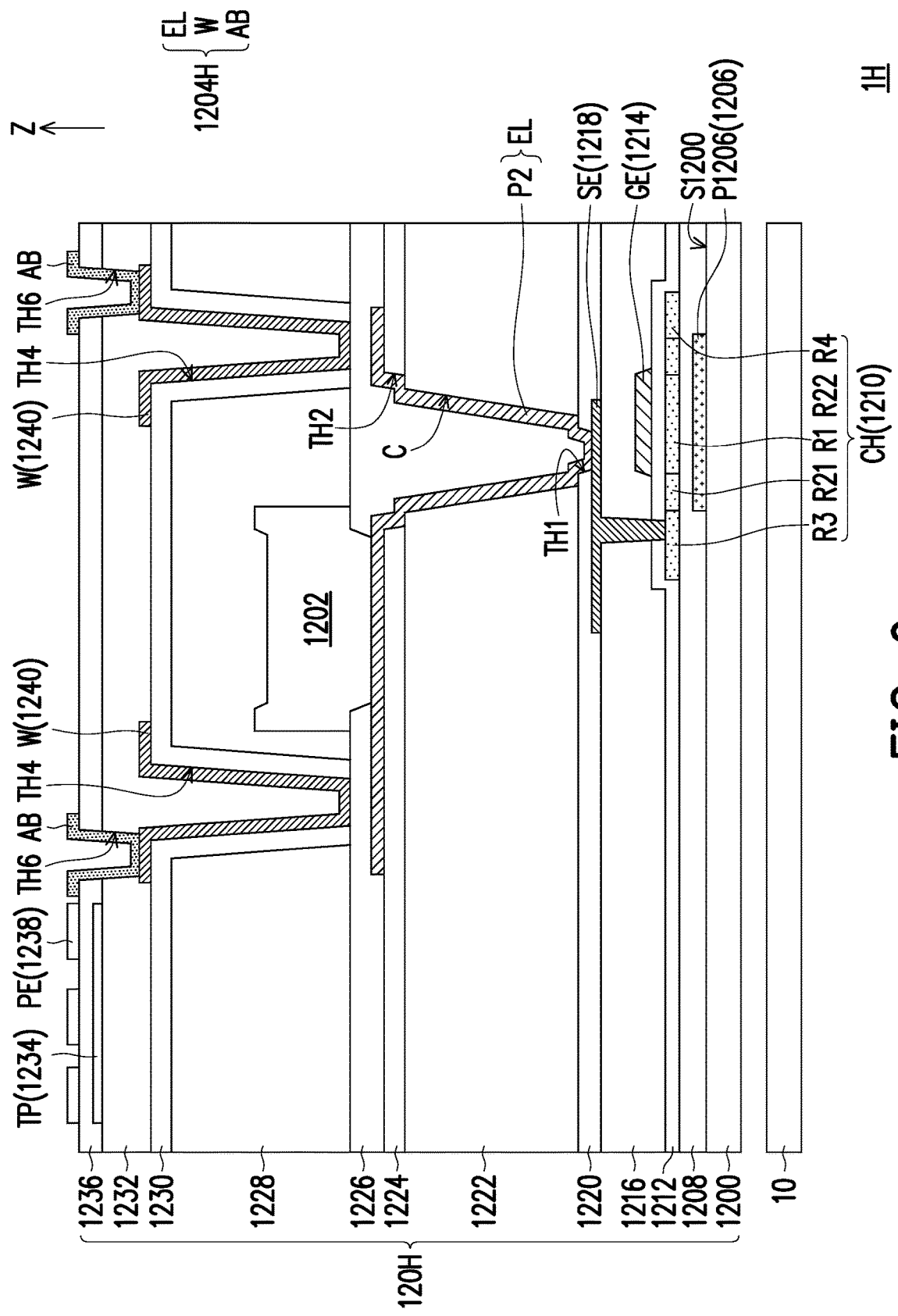

Please refer to FIG. 9, the main differences between a display device 1H and the display device 1G of FIG. 8 are as follows. In a first substrate structure 120H of the display device 1H, in addition to the light-shielding element (the bottom electrode EL and the signal wires W), a light-shielding element 1204H may also include the light-shielding element AB. The light-shielding element AB may be in contact with/connected to the signal wires W via a through hole TH6. The through hole TH6 may penetrate through the insulating layer 1236 and be extended into the insulating layer 1232 to expose a portion of the signal wires W. In the architecture of FIG. 9, the through hole TH4 may also be further extended into the insulating layer 1226 to expose a portion of the bottom electrode EL, and the signal wires W may be in contact with/connected to the bottom electrode EL via the through hole TH4. For example, the material of the light-shielding element AB may include a light-reflecting material or a light-absorbing material (for example, black resin or other light-absorbing materials).

Figure 10:
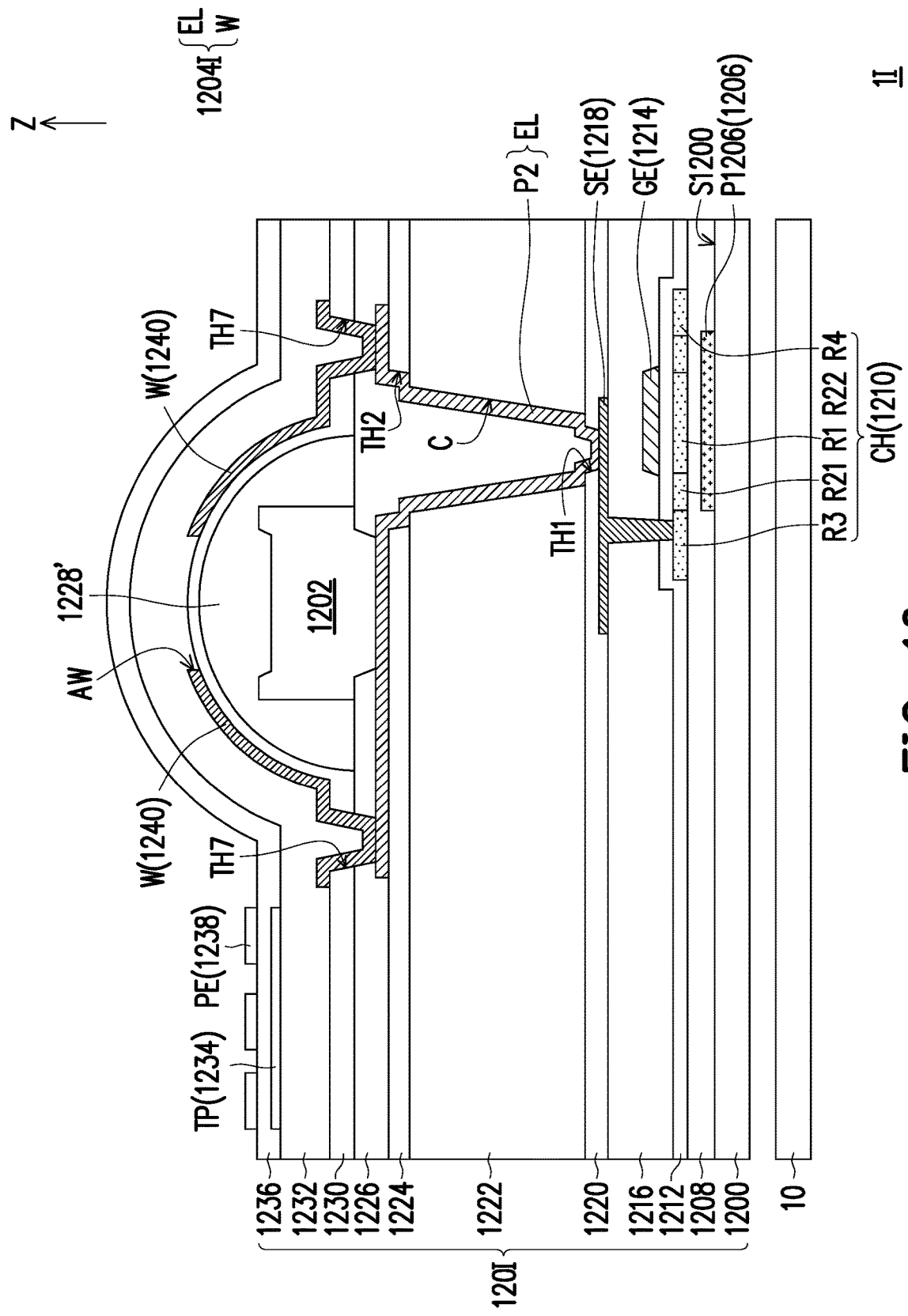

Please refer to FIG. 10, the main differences between a display device 1I and the display device 1F of FIG. 7 are as follows. In an embodiment, in a first substrate structure 120I of the display device 1I, an insulating layer 1228' may be disposed at the sensor 1202 and the surroundings thereof, and the surface of the insulating layer 1228' may, for example, present an arc shape or other suitable shapes, but the disclosure is not limited thereto. In other embodiments, the insulating layer 1228' may also be the same layer as the insulating layer 1230, for example, the structure as shown in FIG. 10 is formed via a deposition process and a lithography process, without the interface between the insulating layer 1228' and the insulating layer 1230. The signal wires W may cover the insulating layer 1228' and have an opening AW exposing the sensor 1202. The size of the opening AW may be determined according to needs, and the disclosure is not limited in this regard. In some embodiments, the maximum width of the opening AW may be equal to or smaller than the maximum width of the sensor 1202, but the disclosure is not limited thereto. In other embodiments, the maximum width of the opening AW may be greater than the maximum width of the sensor 1202 (please refer to the following FIG. 11 to FIG. 14), but the disclosure is not limited thereto. The maximum width of the opening AW may be between 0.6 times and 1.5 times the maximum width of the sensor 1202, such as 0.9 times or 1.2 times, but the disclosure is not limited thereto.

The signal wires W may be in contact with/connected to the bottom electrode EL via a through hole TH7. The through hole TH7 may penetrate through the insulating layer 1230 and be extended into the insulating layer 1226 to expose a portion of the bottom electrode EL. For example, under this architecture, since the design of the insulating layer 1228' is changed to a hemispherical design, the thickness of the insulating layer 1228' does not need to be considered when forming the through hole TH7, instead the thickness of the insulating layer 1230 and a portion of the insulating layer 1226 needs to be considered. Therefore, the size of the through hole TH7 may be effectively reduced, thereby increasing the pixel opening ratio, but the disclosure is not limited thereto. In other embodiments not shown, the through hole TH7 may also penetrate through the insulating layer 1230 and expose a portion of the insulating layer 1226, and the signal wires W may be in contact with/connected to the insulating layer 1226 via the through hole TH7.

Under the architecture of FIG. 10, the bottom electrode EL and the signal wires W may be collectively used as a light-shielding element 1204I. In the light-shielding element 1204I, the bottom electrode EL may be configured to block stray light close to the side of the substrate 1200. Moreover, the signal wires W may be configured to block stray light from the side of the sensor 1202 and from the side close to the pixel electrodes PE.

In order to facilitate the reader's understanding and the conciseness of the figures, FIG. 11 to FIG. 14 schematically show a partial region of the first substrate structure in the display device (including a plurality of opening regions R and the region where the sensor 1202 is located). For other structures not shown (such as the switch element in each pixel, the switch element electrically connected to the sensor 1202, or other circuits), please refer to the above description, which are not repeated herein. The open regions R may correspond to the pixels.

Figure 12:
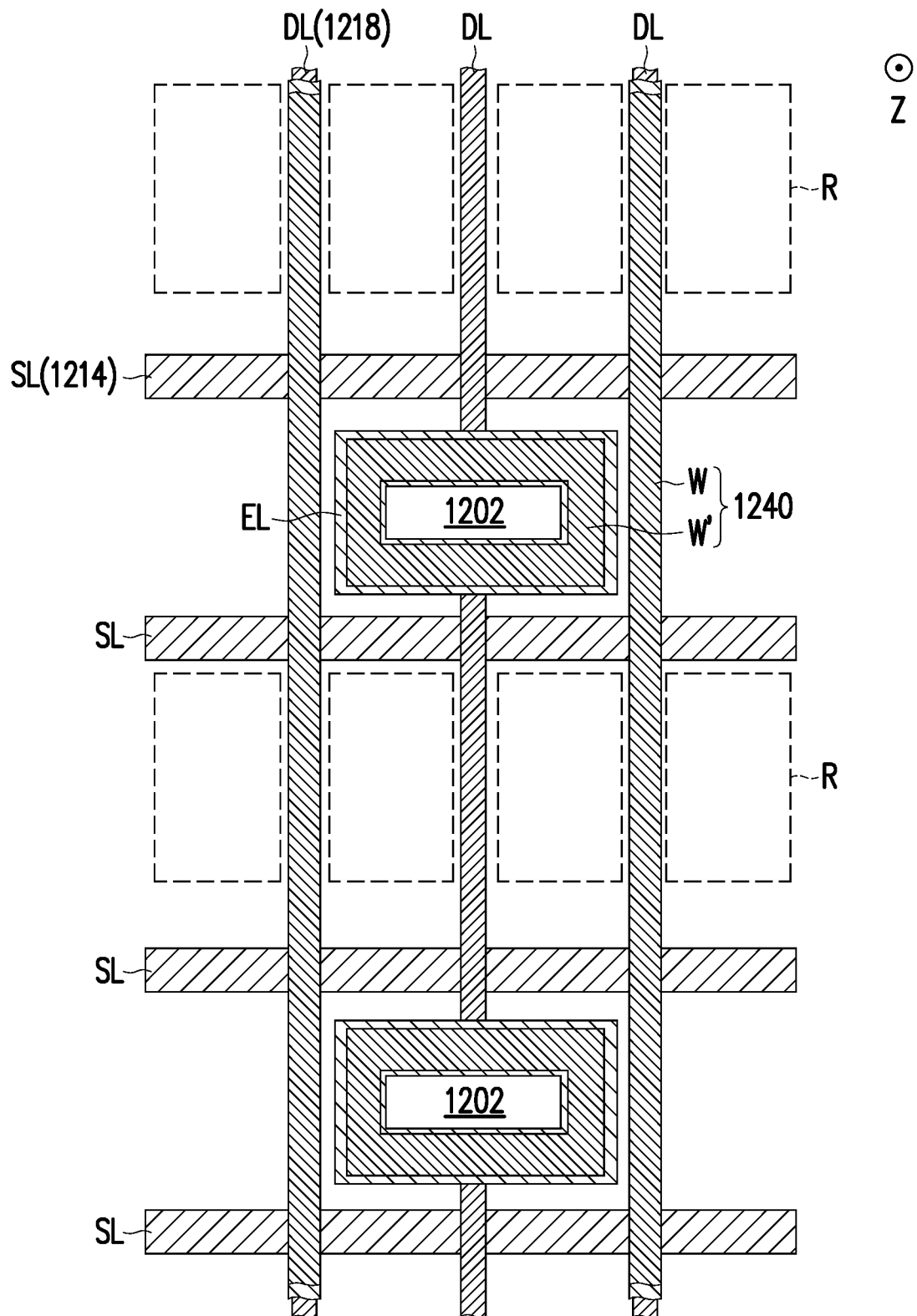
Figure 13:
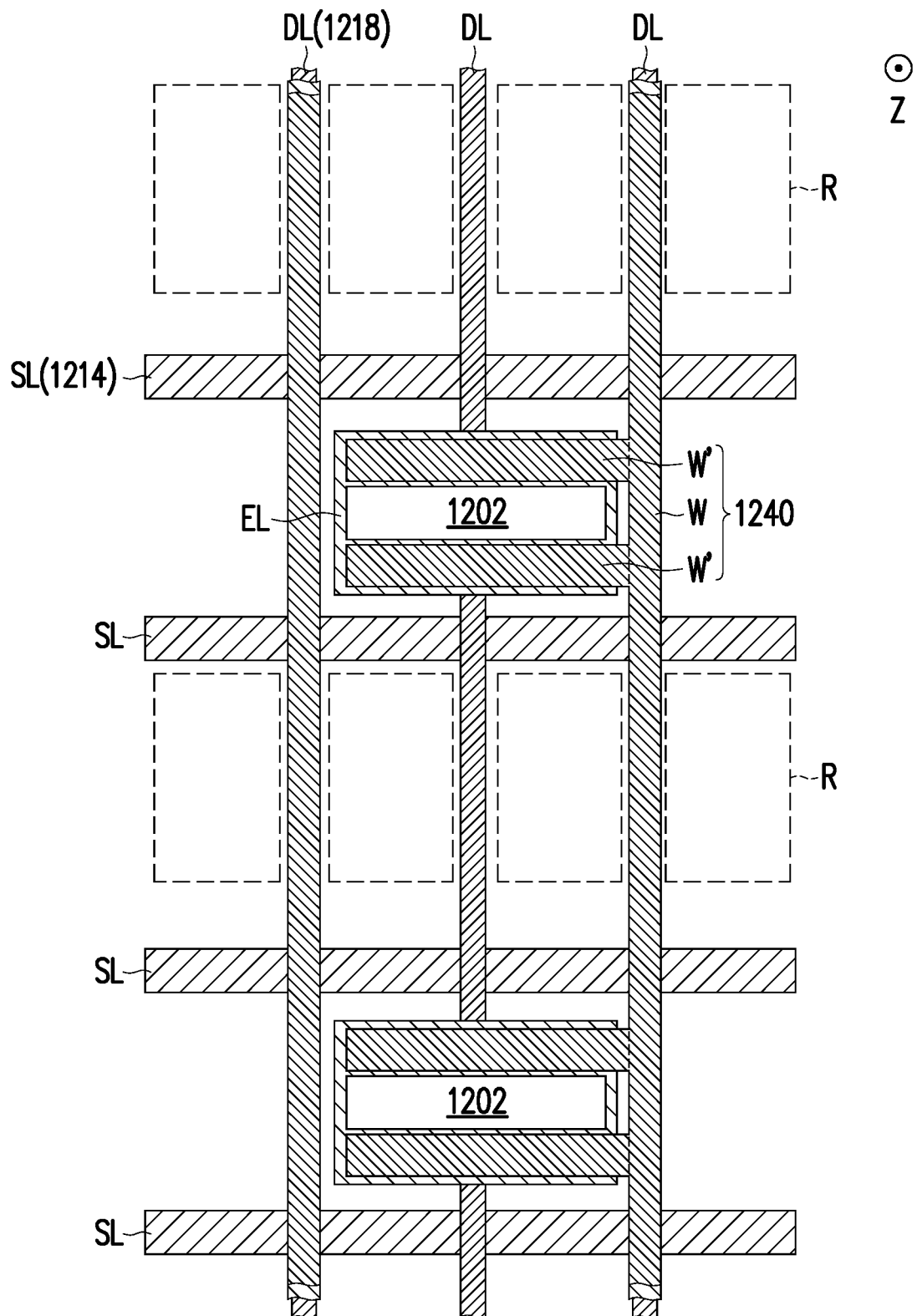
Figure 14:
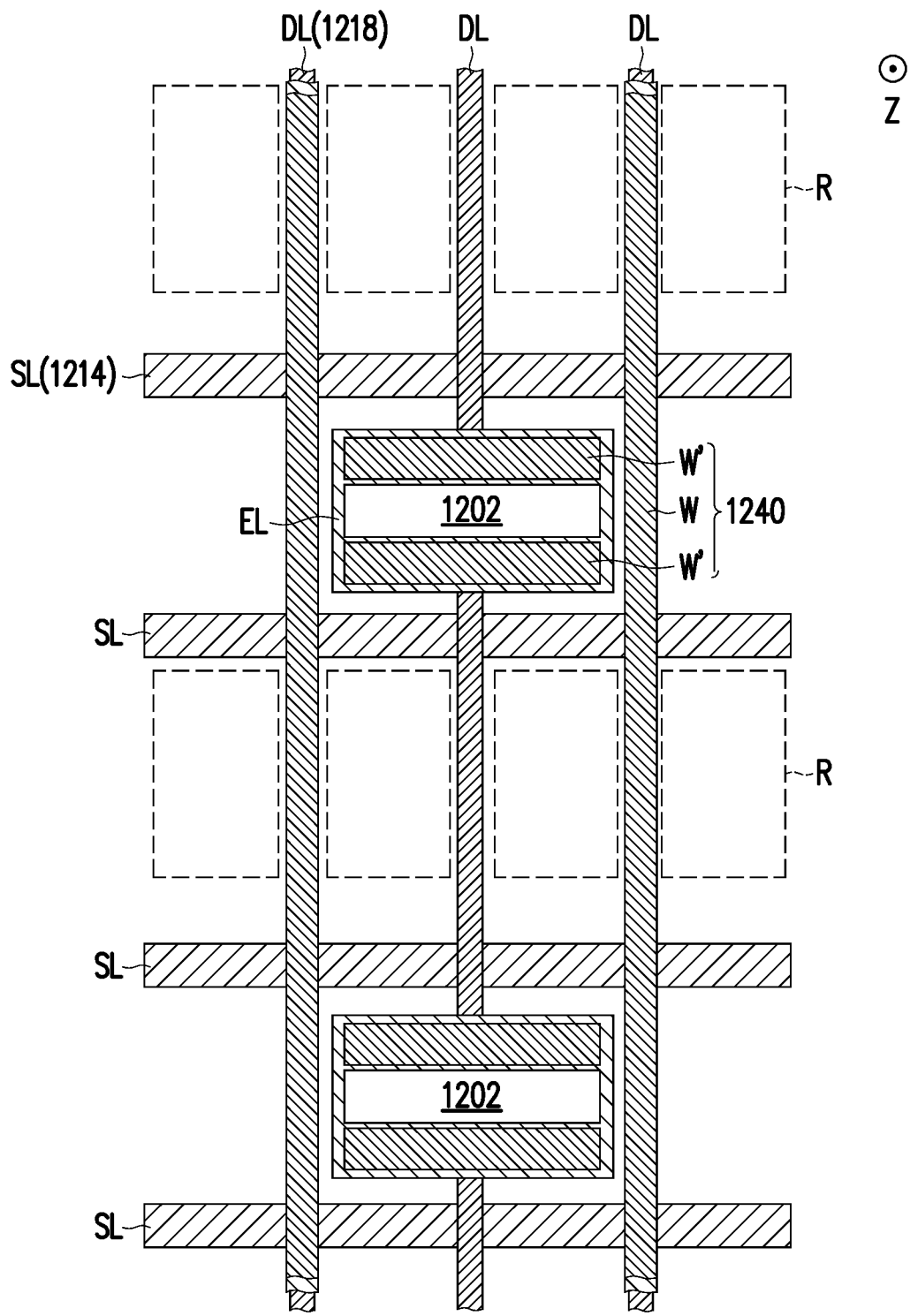

Referring to FIG. 11 to FIG. 14, the sensor 1202 may be disposed between two adjacent scan lines SL, but the disclosure is not limited thereto. In addition to the bottom electrode EL and the signal wires W, the light-shielding element may also include a light-shielding pattern W'. The signal wires W and the light-shielding pattern W' may belong to the fourth conductive layer 1240, but the disclosure is not limited thereto. In some embodiments, as shown in FIG. 11 and FIG. 12, the light-shielding pattern W' may surround the sensor 1202. In other embodiments, as shown in FIG. 13 and FIG. 14, the light-shielding pattern W' may be disposed at the opposite side of the sensor 1202 facing the plurality of opening regions R to reduce the influence of stray light from the plurality of opening regions R on the sensor 1202. In some embodiments, as shown in FIG. 11 and FIG. 13, the signal wires W and the light-shielding pattern W' may be connected to each other. In other embodiments, as shown in FIG. 12 and FIG. 14, the signal wires W and the light-shielding pattern W' may be separated from each other.

Based on the above, in an embodiment of the disclosure, stray light is blocked by the light-shielding element, thereby reducing the influence of the stray light on the sensor. In some embodiments, the bottom electrode of the sensor may be used as the light-shielding element. In some embodiments, the light-absorbing element may be disposed to block stray light from a high place.

The above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

Although the embodiments of the disclosure and their advantages are disclosed as above, it should be understood that any person skilled in the art, without departing from the spirit and scope of the disclosure, may make changes, substitutions, and modifications, and features between the embodiments may be mixed and replaced at will to form other new embodiments. In addition, the scope of the disclosure is not limited to the manufacturing processes, machinery, manufactures, material compositions, devices, methods, and steps in the specific embodiments described in the specification. Any person skilled in the art may understand the current or future development processes, machinery, manufactures, material compositions, devices, methods, and steps from the content of the disclosure, which may all be adopted according to the disclosure as long as they may implement substantially the same function or obtain substantially the same result in an embodiment described here. Therefore, the scope of the disclosure includes the above manufacturing processes, machinery, manufactures, material compositions, devices, methods, and steps. Moreover, each claim constitutes an individual embodiment, and the scope of the disclosure also includes substitutions, modifications, combinations, and/or recombinations of the features in each claim and embodiment. The scope of the disclosure shall be subject to the scope defined by the following claims.

What is claimed is:

1. An electronic device, comprising:
   a substrate;
   a sensor disposed on the substrate; and
   a light-shielding element at least partially surrounding the sensor;
   wherein a height of the light-shielding element is greater than a height of the sensor, and
   wherein a portion of the light-shielding element is between the sensor and the substrate.

2. The electronic device of claim 1, wherein a length of the portion of the light-shielding element is greater than or equal to a thickness of the sensor.

3. The electronic device of claim 1, wherein the portion of the light-shielding element is a conductor.

4. An electronic device, comprising:
   a substrate;
   a sensor disposed on the substrate;
   a light-shielding element at least partially surrounding the sensor; and
   an insulating layer having a recess, wherein at least a portion of the light-shielding element is disposed in the recess.

5. The electronic device of claim 4, wherein the sensor is disposed in the recess and on the light-shielding element.

6. The electronic device of claim 4, wherein the light-shielding element comprises a light-absorbing element, a light-reflecting element, or a combination of the above.

7. An electronic device, comprising:
   a substrate;
   a sensor disposed on the substrate; and
   a light-shielding element, wherein a portion of the light-shielding element is between the sensor and the substrate;
   wherein a length of the portion of the light-shielding element is greater than or equal to a thickness of the sensor.

8. The electronic device of claim 7, wherein a height of the portion of the light-shielding element is smaller than a height of the sensor.

9. The electronic device of claim 7, wherein the light-shielding element comprises a light-absorbing element, a light-reflecting element, or a combination of the above two.

10. The electronic device of claim 7, further comprising:
    an electrode disposed between the sensor and the substrate, wherein the electrode is used as the portion of the light-shielding element between the sensor and the substrate.

11. The electronic device of claim 10, further comprising:
    a plurality of signal wires used as another portion of the light-shielding element, wherein the sensor is disposed between the plurality of signal wires, and the electrode is disposed between the plurality of signal wires and the substrate.

12. The electronic device of claim 11, wherein the signal wires are separated from the electrode via an insulating layer, and the signal wires, the insulating layer, and the electrode form a capacitor.

13. The electronic device of claim 11, wherein the signal wires are in contact with the electrode.

14. The electronic device of claim 11, further comprising:
    an insulating layer disposed on the sensor, and a surface of the insulating layer presents an arc shape.

15. The electronic device of claim 14, wherein the signal wires are overlapped with the insulating layer and have an opening exposing the sensor, and a maximum width of the opening is between 0.6 and 1.5 times a maximum width of the sensor.

* * * * *